United States Patent [19]

Sahm

[11] Patent Number: 4,792,886

[45] Date of Patent: Dec. 20, 1988

[54] DEVICE COMPRISING AN ELECTRONIC CIRCUIT FOR PROCESSING AN ANALOG SIGNAL

[75] Inventor: Hans W. Sahm, Lauf, Fed. Rep. of Germany

[73] Assignee: EM Microelectronic Marin SA, Marin, Switzerland

[21] Appl. No.: 156,880

[22] Filed: Feb. 18, 1988

[30] Foreign Application Priority Data

Feb. 19, 1987 [FR] France .................. 87 02356

[51] Int. Cl.$^4$ .............................. H02M 7/25
[52] U.S. Cl. ....................... 363/60; 323/299; 323/303
[58] Field of Search ............ 363/59, 60, 61; 323/311, 312, 313, 314, 315, 316, 317, 268, 273, 299, 303

[56] References Cited

U.S. PATENT DOCUMENTS

| | | | |
|---|---|---|---|
| 3,867,949 | 2/1975 | Schwalm et al. | 323/313 |
| 3,955,353 | 5/1976 | Astle | 363/60 |
| 4,259,600 | 3/1981 | Fellrath et al. | 363/61 |
| 4,451,744 | 5/1984 | Adam | 323/313 |

*Primary Examiner*—Peter S. Wong
*Attorney, Agent, or Firm*—Sughrue, Mion, Zinn, Macpeak, and Seas

[57] ABSTRACT

The device (1) comprises an electronic circuit (2) for processing an analog signal and a voltage multiplying (or boosting) circuit (3) for providing the supply voltage (Ua) to the electronic circuit (2) from the voltage (Up) supplied by a cell (P). The device (1) moreover comprises means (4) that respond to the supply voltage (Ua) to vary the internal resistance (R) of the electronic circuit (2) in inverse ratio to the supply voltage (Ua). This variation in the internal resistance (R) of the electronic circuit (2) brings about a limitation in the variations of the supply voltage (Ua) in dependence on the voltage (Up) supplied by the cell (P) and on the current consumed by the electronic circuit (2). The device is meant to be used in portable apparatus of small size such as hearing aids.

3 Claims, 2 Drawing Sheets

DEVICE COMPRISING AN ELECTRONIC CIRCUIT FOR PROCESSING AN ANALOG SIGNAL

BACKGROUND OF THE INVENTION

This invention relates to a device comprising an electronic circuit for processing an analog electric signal and a voltage multiplying (or boosting) circuit intended to be connected to an electrical energy supply source, to provide a supply voltage to said electronic circuit.

Many forms of apparatus that comprise a device of the above kind, e.g. hearing aids, remote controls for toys, miniature radioreceivers, etc., are of such small size that the electric energy supply source of the device may only consist of a cell or a miniature rechargeable battery. Such a cell or battery necessarily only has a single electro-chemical element.

A cell or a battery having only a single element supplies when new a voltage of 1.5 to 1.7 V or a voltage of 2 to 2.2 V, respectively. These voltages obviously decrease when the cell or the battery discharges.

The electronic circuit comprised by a device of the above mentioned kind generally includes one or more amplifiers that require a minimum supply voltage of about 2 V to ensure proper operation.

That is why such a device generally includes a voltage multiplying circuit to produce the supply voltage needed by the amplifiers from the voltage supplied by the above mentioned cell or battery.

The small size of the various forms of apparatus using these devices and the need to produce them at the lowest possible cost moreover make it imperative for all of the components of the electronic device to be formed in one and the same integrated circuit.

Now, a voltage multiplying circuit that is produced in an integrated circuit, having no component external to the integrated circuit, has rather poor electrical characteristics.

In particular, its internal resistance is high so that its output voltage very much depends on the current that is used by the circuits it supplies.

It is in practice not possible to correct these defects, even partially, by inserting a voltage stabiliser between the voltage multiplier and the circuits it supplies because such a stabiliser, to operate properly, would require an input voltage that is a good deal higher than the voltage it is required to supply.

Now, a voltage multiplying circuit like the one mentioned above cannot in practice supply the voltage stabiliser with this high input voltage because of the voltage drops that necessarily occur in the various stages of the voltage multiplying circuit and which are not much less than the voltage supplied by the cell or the battery.

SUMMARY OF THE INVENTION

An object of the present invention is to provide a device comprising an electronic circuit for processing an analog electric signal and a voltage multiplying circuit intended to be connected to an electrical energy supply source to provide a supply voltage to said electronic circuit and comprising first and second terminals between which said supply voltage is produced that does not suffer from the above mentioned drawbacks, i.e. wherein the supply voltage for the electronic circuit comprised by the device does not vary beyond the limits between which the circuit will operate properly, despite the unfavourable characteristics of the voltage multiplying circuit that produces the supply voltage.

To this end the device according to the invention comprises means for varying the internal resistance of the electronic circuit comprised by the device in inverse ratio to the voltage supplied to the electronic circuit.

BRIEF DESCRIPTION OF THE DRAWINGS

The invention will now be described with reference to the accompanying drawings, in which.

DETAILED DESCRIPTION

Figure 1:
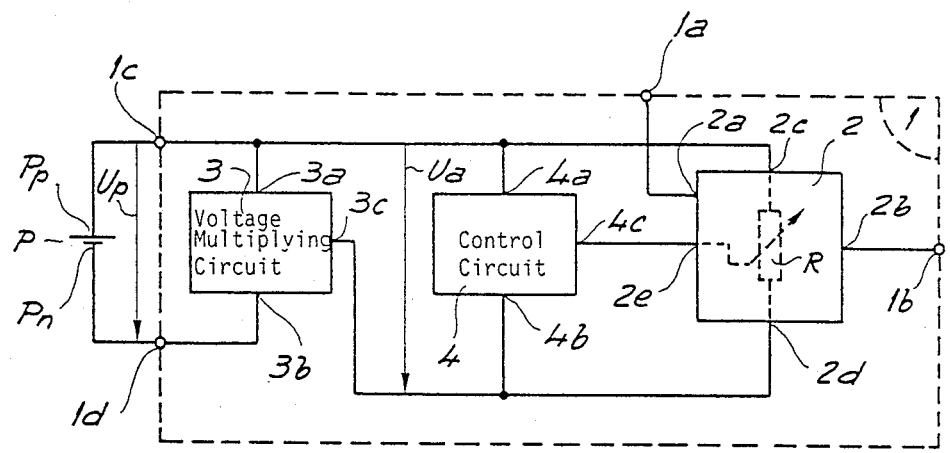
FIG. 1 is a block diagram of an embodiment of the device according to the invention.

The device, 1, shown diagrammatically in FIG. 1 is intended for use in a hearing aid.

In view of the small size of a hearing aid all of the device's elements about to be described are produced in an integrated circuit by one of the well-known manufacturing methods in this field and which will not be described here.

Device 1 comprises an amplifier circuit 2 whose input 2a is connected, via a terminal 1a of device 1, to a microphone not shown. The output 2b of amplifier 2 is connected, via a terminal 1b of the device 1, to a loudspeaker that is not shown either.

Amplifier 2 is well-known and will not be described here in detail except to say that it generally comprises filters whose characteristics are so determined that the variation of its gain in dependence on the frequency of the signal it receives on its input 2a is adapted to the auditive deficiencies of the person wearing the hearing aid.

These filters, which are generally of the so-called "switched capacitors" type, are also well-known and will not be described in detail here. Suffice it to say that these filters each include at least one operational amplifier, one example of which will be described further on.

Device 1 has a pair of supply terminals 1c and 1d which are respectively connected to the positive terminal Pp and to the negative terminal Pn of a cell P supplying a voltage Up.

Device 1 further comprises a voltage multiplying circuit 3 having a pair of supply terminals 3a and 3b that are respectively connected to terminals 1c and 1d of device 1, and hence to terminals Pp and Pn of cell P. The make-up and operation of voltage multiplying circuit 3 will be discussed later. Suffice it to note here that in this embodiment the potential of its output 3c is more negative than that of its supply terminal 3b, provided the current it is required to deliver is not too high.

Supply terminals 2c and 2d of electronic circuit 2 are respectively connected to terminal 1c of device 1, and hence to terminal Pp of cell P, and to terminal 3c of voltage multiplying circuit 3. The supply voltage Ua of electronic circuit 2, which is equal to the difference between the potentials of terminals 3a and 3c of voltage multiplying circuit 3, is therefore higher than the voltage Up of cell P, provided however the current consumption of circuit 2 is not too high.

Device 1 also comprises a control circuit 4 having supply terminals 4a and 4b that are respectively connected to terminal 1c of device 1 and to terminal 3c of voltage multiplying circuit 3. Control circuit 4 is thus supplied by the same voltage as electronic circuit 2.

Control circuit 4 has an output 4c which is connected to an input 2e of circuit 2. Circuit 4 issues, on output 4c, a signal that controls means forming part of circuit 2 in such manner that the internal resistance of the latter varies in inverse ratio to voltage Ua, i.e. in such manner that this internal resistance will increase when voltage Ua decreases, and vice-versa.

The internal resistance of circuit 2 is symbolised by a variable resistance R that is connected between terminals 2c and 2d and which is depicted by a broken line in FIG. 1.

One example of each of circuits 2 and 4 will be described in detail below, along with its operation.

As mentioned earlier, the room available in the hearing aid that is fitted with device 1 is very limited. This means that voltage multiplying circuit 3 cannot have a single component external to the integrated circuit in which device 1 is produced, in particular no transformer or self-inductance coil.

Voltage multiplying circuit 3 must therefore for instance be of the kind that includes a plurality of capacitors that are alternately charged by the supply source of the circuit and discharged into an output capacitor of the circuit.

Such a voltage multiplying circuit will not be described in detail here as it is well-known to specialists. It should simply be noted that the capacitors it comprises necessarily have fairly low capacitances, since they must be produced in the integrated circuit. It thus follows in particular that the internal resistance of voltage multiplying circuit 3 is very high, as will be observed from FIG. 2 which diagrammatically shows how voltage Ua supplied by voltage multiplying circuit 3 varies in dependence on the current i that is consumed by circuits 2 and 4 of device 1, with three different voltage values for cell P, i.e. Up1, Up2 and Up3. Voltage Up1 is, for instance, that supplied by cell P when new, voltage Up2 is that typically supplied by cell P for the greater part of its useful life, and voltage Up3 is that supplied by cell P when it is almost dead.

In practice, the energy consumption of control circuit 4 is much lower than that of electronic circuit 2, as will become clear from the following description of these two circuits. To simplify matters, it will thus be assumed that the current i is that being consumed by electronic circuit 2.

Figure 2:
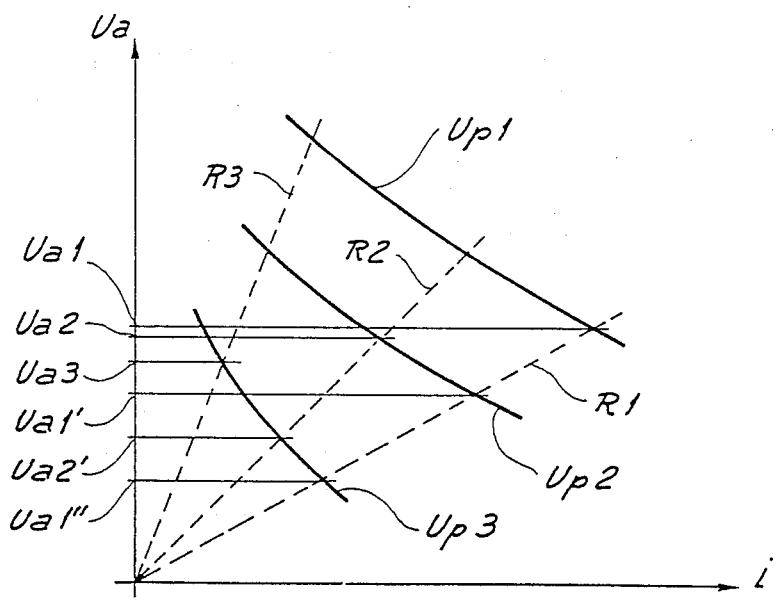
FIG. 2 illustrates the characteristics of one of the circuits in FIG. 1.

The above mentioned high internal resistance of voltage multiplying circuit 3 is represented by the steep negative slopes of the characteristic curves of FIG. 2. These slopes may amount to several tenths of a volt per micro-ampere, indicative of an internal resistance of several hundred kilo-ohms.

Additionally, the low capacitance of the capacitors in voltage multiplying circuit 3 also means that the variations of the voltage Ua in dependence on voltage Up for a given value of internal resistance R in circuit 2 are very large, as is apparent from FIG. 2. Thus, for instance, in an experimental device wherein circuit 2 had an internal resistance R of about 200 kilo-ohms, voltage Ua varied from about 2.8 volts to about 1.2 volts when voltage Up varied from 1.4 volts to 1 volt, with circuit 4 and the corresponding means of circuit 2 being inoperative.

As already mentioned, control circuit 4 and electronic circuit 2 are so arranged that the internal resistance R of the latter will vary in inverse ratio to voltage Ua.

Suppose to begin with that voltage Up of cell P has the above value Up1 and that circuit 4 so controls circuit 2 that the latter's internal resistance R has a value R1 depicted in FIG. 2 by a correspondingly referenced broken straight line.

Voltage Ua would then have the value Ua1 indicated in FIG. 2.

When the cell's voltage Up decreases to, for instance, value Up2, voltage Ua tends to drop.

In the absence of circuit 4 and of the corresponding means of circuit 2, voltage Ua would decrease to value Ua1'. But circuit 4 reacts to this decrease in the voltage Ua by causing the internal resistance R of circuit 2 to increase to a value R2 depicted in FIG. 2 by a correspondingly referenced broken straight line. As a result, voltage Ua only drops to value Ua2 which is much closer to value Ua1 than value Ua1' mentioned above.

Similarly, if voltage Up drops to value Up3, circuit 4 reacts to the resulting drop in voltage Ua by increasing still further the internal resistance R of circuit 2 to a value R3 depicted in FIG. 2 by a correspondingly referenced broken straight line.

As a result voltage Ua only drops to value Ua3, whereas it would have dropped to value Ua2' had the internal resistance R of circuit 2 remained at value R2, and even to value Ua1" had the internal resistance R remained at value R1.

In short, control circuit 4 and the means associated therewith in circuit 2 cause a substantial decrease in the variations of voltage Ua in dependence on the variations of voltage Up, by modifying the internal resistance R of circuit 2 in inverse ratio to voltage Ua.

A process similar to that described above will of course take place if the internal resistance R of circuit 2 changes for any reason, without this change being brought on by circuit 4. In such a case, circuit 4 reacts to the variation in voltage Ua caused by this change in the internal resistance R of circuit 2 by returning this internal resistance R to its initial value, which in turn returns voltage Ua to its initial value.

The above described process is of course continuous, i.e. if voltage Up varies in a continuous manner between its values Up1 and Up3, voltage Ua also varies in a continuous manner between its values Ua1 and Ua3.

The above process has been described on the assumption that voltage Up drops from its value Up1 to its value Up3. Clearly, the process is reversible and should voltage Up increase instead of dropping, for any reason, circuit 4 and the means associated therewith in circuit 2 would react to the resulting increase in voltage Ua by decreasing the internal resistance R of circuit 2, thereby limiting this increase in voltage Ua.

As already stated, the device according to the invention is intended, in the embodiment described, to be fitted in a hearing aid. The device thus is provided, in well-known manner, with low-pass, high-pass and band-pass filters. These filters may be of different kinds and will not be described in detail here as they too are well-known and are of no direct concern to the invention. Suffice it to say that they each comprise at least one operational amplifier.

Figure 3:
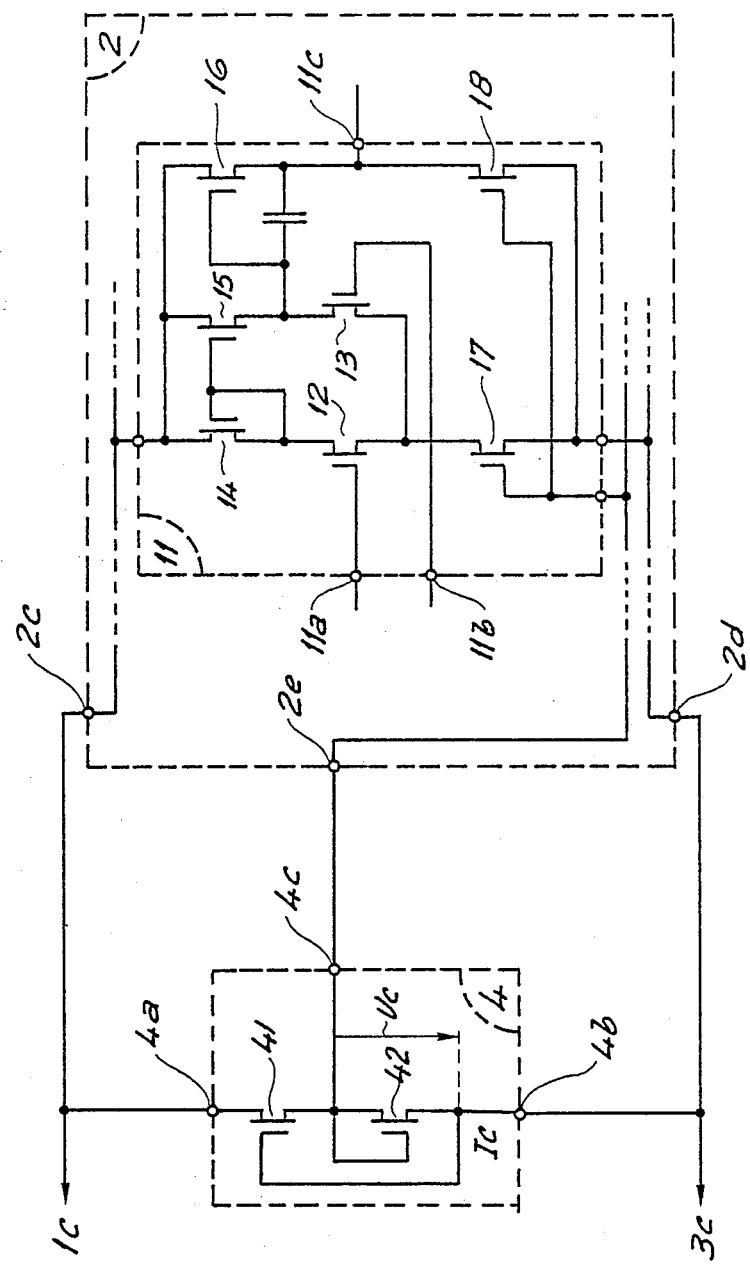
FIG. 3 is a diagram of a second circuit and of part of a third circuit used in FIG. 1.

One such amplifier, 11, is shown in FIG. 3 and comprises in conventional manner a pair of inputs 11a and 11b and an output 11c. The connections of inputs 11a and 11b and of output 11c with the other components of circuit 2, and these other components, have not been shown as they are conventional and are of no direct relevance to the invention.

In an equally conventional manner, amplifier 11 comprises two transistors 12 and 13 which here are N-type MOS transistors. The gates of transistors 12 and 13 are respectively connected to inputs 11a and 11b.

The drains of transistors 12 and 13 are connected as shown in FIG. 3 to three P-type MOS transistors 14, 15 and 16. The connections between transistors 12 to 16 will not be described here, as they are conventional and are of no direct relevance to the invention. Suffice to note that the sources of transistors 14, 15 and 16 are connected to terminal 2c of circuit 2 and hence to terminal 1c of device 1 (FIG. 1).

Again in a conventional manner, the sources of transistors 12 and 13 are connected together to the drain of an N-type MOS transistor 17, and the source of transistor 16 is connected to the drain of another N-type MOS transistor, 18. The sources of transistors 17 and 18 are connected to terminal 2d of circuit 2 and hence to terminal 3c of voltage multiplying circuit 3 (FIG. 1).

In known operational amplifiers, transistor 17 serves to supply transistors 12 and 13 with a constant current of set intensity so that the operating point of transistors 12 and 13 may be whatever one is chosen.

Further, again with known amplifiers, transistor 18 serves to limit the current being consumed by the circuit, not shown, that is connected to output 11c. The gates of transistors 17 and 18 are thus connected to sources that supply a constant voltage that is so set that the above mentioned currents may have the required intensities.

But in the present invention, amplifiers 17 and 18, along with the corresponding transistors of the other amplifiers that form part of circuit 2 and that are not shown in FIG. 3, make up the means, mentioned in connection with FIG. 1, that are associated with control circuit 4 to vary the internal resistance R of circuit 2 in inverse ratio to supply voltage Ua.

To this end, their gates are connected to terminal 2e of circuit 2 and hence to output 4c of control circuit 4.

The latter, which is also shown in FIG. 3, comprises a P-type MOS transistor 41 and an N-type MOS transistor 42.

The sources of transistors 41 and 42 are respectively connected to terminals 4a and 4b of circuit 4 and hence to terminal 1c of device 1 and to terminal 3c of voltage multiplying circuit 3 (FIG. 1).

The drains of transistors 41 and 42 are connected to one another and to the output 4c of circuit 4.

Moreover, the gate of transistor 41 is connected to terminal 4b of circuit 4, and the gate of transistor 42 is connected to its drain. Transistor 42 thus in practice has the characteristic of a plain resistor.

Current Ic flowing through transistors 41 and 42 is essentially determined by the voltage across the gate and the source of transistor 41, which is voltage Ua supplied by multiplying circuit 3.

Current Ic causes in transistor 42 a voltage drop Uc which constitutes the output voltage of control circuit 4 and which is applied across the gate and the source of transistors 17 and 18.

A decrease in voltage Ua thus causes a decrease in current Ic which in turn causes a decrease in voltage Uc and hence a decrease in the current flowing in transistors 17 and 18 or, which amounts to the same thing, an increase in the internal resistance of transistors 17 and 18.

The same of course applies to all transistors, similar to transistors 17 and 18, that form part of the other amplifiers, not shown, comprised by circuit 2 and whose gate and source are also respectively connected to input 2e and to terminal 2d of circuit 2.

The above described process being of course reversible, an increase in voltage Ua would naturally cause a decrease in the internal resistance of transistors 17 and 18 and of all of the other above mentioned transistors.

The internal resistance R of circuit 2 is of course directly dependent on the internal resistance of the transistors such as transistors 17 and 18.

Thus, circuit 4 and the transistors associated therewith in circuit 2 cause the internal resistance R of circuit 2 to vary in inverse ratio to any variation in the voltage Ua produced by the voltage multiplying circuit 3. The consequences of this variation in the internal resistance R of circuit 2 have been described above in connection with FIGS. 1 and 2 and will not again be described here.

The characteristics of circuit 4 and of the transistors associated therewith in circuit 2 must of course be adapted to the characteristics of voltage multiplying circuit 3 so that the internal resistance R of circuit 2 may vary in dependence on voltage Ua in the manner and with the effects described above.

Knowing the characteristics of voltage multiplying circuit 3 and the extreme values of voltage Ua at which circuit 2 still operates properly, e.g. values Ua1 and Ua3 in FIG. 2, it is a simple matter to determine what the extreme values of the internal resistance R in circuit 2, i.e. values R1 and R3, should be.

Knowing moreover the number of transistors such as 17 and 18 comprised by circuit 2, it is also a simple matter to determine what values the current flowing in each of them should have for the internal resistance R of circuit 2 to be equal to values R1 and R3.

As is well known, the current flowing in a MOS transistor is directly dependent on the voltage applied across its gate and its source and on the ratio between the width and length of its channel.

Having ascertained the extreme values of the current required to flow in the transistors such as 17 and 18, it is then possible to work out the dimensions of the channel for each of these transistors and the required values for the voltage Uc applied by control circuit 4 across their gate and source for each of these extreme current values.

It is then for instance possible arbitrarily to select the dimensions of the channel in transistor 42, thereby determining the value of its resistance. Knowing this resistance, it is then possible to work out the value current Ic should have for each of the above determined extreme values of voltage Uc.

The dimensions of the channel in transistor 41 may then be calculated so that current Ic will have these extreme values when voltage Ua has its above mentioned acceptable extreme values.

In the example just described, the control signal that is produced by circuit 4 to cause the internal resistance R of circuit 2 to vary in inverse ratio to voltage Ua is provided by voltage Uc.

In another form of embodiment of the device according to the invention, this control signal could be provided by a current. In such an embodiment, control circuit 4 could include a current source that supplies a current that varies in dependence on voltage Ua, and circuit 2 could include means that are responsive to this current to cause the internal resistance of circuit 2 to vary in a manner similar to that described above.

These latter means may for example comprise one or more transistors having their drain and gate connected to one another, as with transistor 42 in FIG. 3, which would respond to the current produced by the above mentioned source to produce a control voltage comparable to voltage Uc produced by transistor 42. The means for varying the internal resistance of circuit 2 would further comprise, still for example, transistors performing the same role as transistors 17 and 18 in FIG. 3 in response to the above mentioned control voltage.

The invention has been described in relation to a case where control circuit 4 and electronic circuit 2 involve MOS transistors but these circuits could clearly also involve bipolar transistors.

Clearly also, the invention is not limited to the described case where the device is intended to be fitted in a hearing aid, and may be used to advantage in any kind of portable apparatus fitted with electronic devices, in particular in small sized apparatus wherein the electronic device is in the form of an integrated circuit and is energized by a cell or a rechargeable battery.

I claim:

1. A device comprising an electronic circuit for processing an analog electric signal and a voltage multiplying circuit that is intended to be connected to a source for supplying electrical energy to produce a supply voltage for said electronic circuit and that has first and second terminals across which said supply voltage is produced, and further comprising means for varying the internal resistance of the electronic circuit in inverse ratio to said supply voltage.

2. A device according to claim 1, wherein said means for varying said internal resistance include means for producing a control signal that is dependent on said supply voltage and means that are incorporated in said electronic circuit and that are responsive to said control signal to vary said internal resistance.

3. A device according to claim 2, wherein said means for producing a control signal include a first MOS transistor whose source and gate are respectively connected to said first and second terminals of said voltage multiplying circuit, and a second MOS transistor whose source is connected to said second terminal of said voltage multiplying circuit and whose gate and drain are together connected to the drain of said first transistor, said control voltage being provided by the voltage drop caused between the drain and the source of said second transistor by the current flowing in said first transistor in response to said supply voltage applied between the gate and the source of said first transistor, and wherein said means that are incorporated in said electronic circuit include at least a third transistor whose source is connected to said second terminal of said voltage multiplying circuit and whose gate is connected to the drains of said first and second MOS transistors.

* * * * *